United States Patent [19]

Coller et al.

[11] Patent Number: 4,637,670

[45] Date of Patent: Jan. 20, 1987

[54] DUAL IN-LINE PACKAGE CARRIER ASSEMBLY

[75] Inventors: James R. Coller; Paul A. Coon; Joseph R. Goodman, all of Kernersville, N.C.

[73] Assignee: AMP Incorporated, Harrisburg, Pa.

[21] Appl. No.: 602,879

[22] Filed: Apr. 23, 1984

[51] Int. Cl.⁴ .......................................... H01R 13/635
[52] U.S. Cl. ................................ 339/46; 339/17 CF; 339/75 MP
[58] Field of Search .................. 339/17 CF, 46, 75 M, 339/75 MP

[56] References Cited

U.S. PATENT DOCUMENTS 3,883,207 5/1975 Tomkiewicz .................... 339/17 CF
4,420,207 12/1983 Nishikawa ....................... 339/17 CF
4,490,001 12/1984 Gordon et al. .................. 339/17 CF

FOREIGN PATENT DOCUMENTS 1152765 5/1969 United Kingdom ........... 339/17 CF

Primary Examiner—John McQuade
Attorney, Agent, or Firm—F. Brice Faller; Robert W. Pitts; Eric J. Groen

[57] ABSTRACT

DIP carrier assembly comprises carrier having support surface with apertures therethrough to channels in side and bottom of carrier into which DIP leads are formed. Terminals aligned in channels in opposed sidewalls of socket apply releasing force on carrier when DIP leads deflect contact portions of terminals. Release of resilient latch on socket causes ejection of carrier.

5 Claims, 7 Drawing Figures

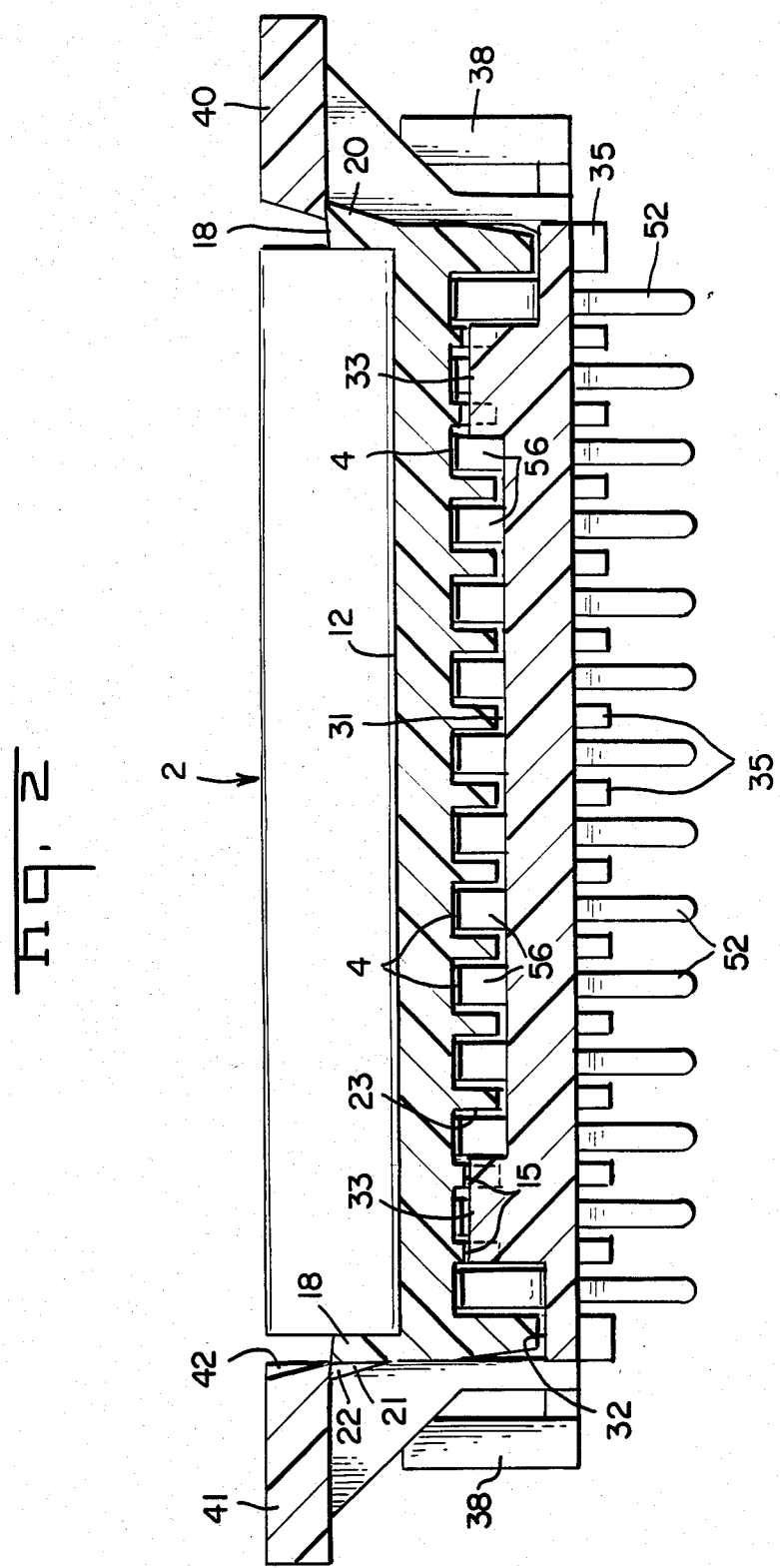

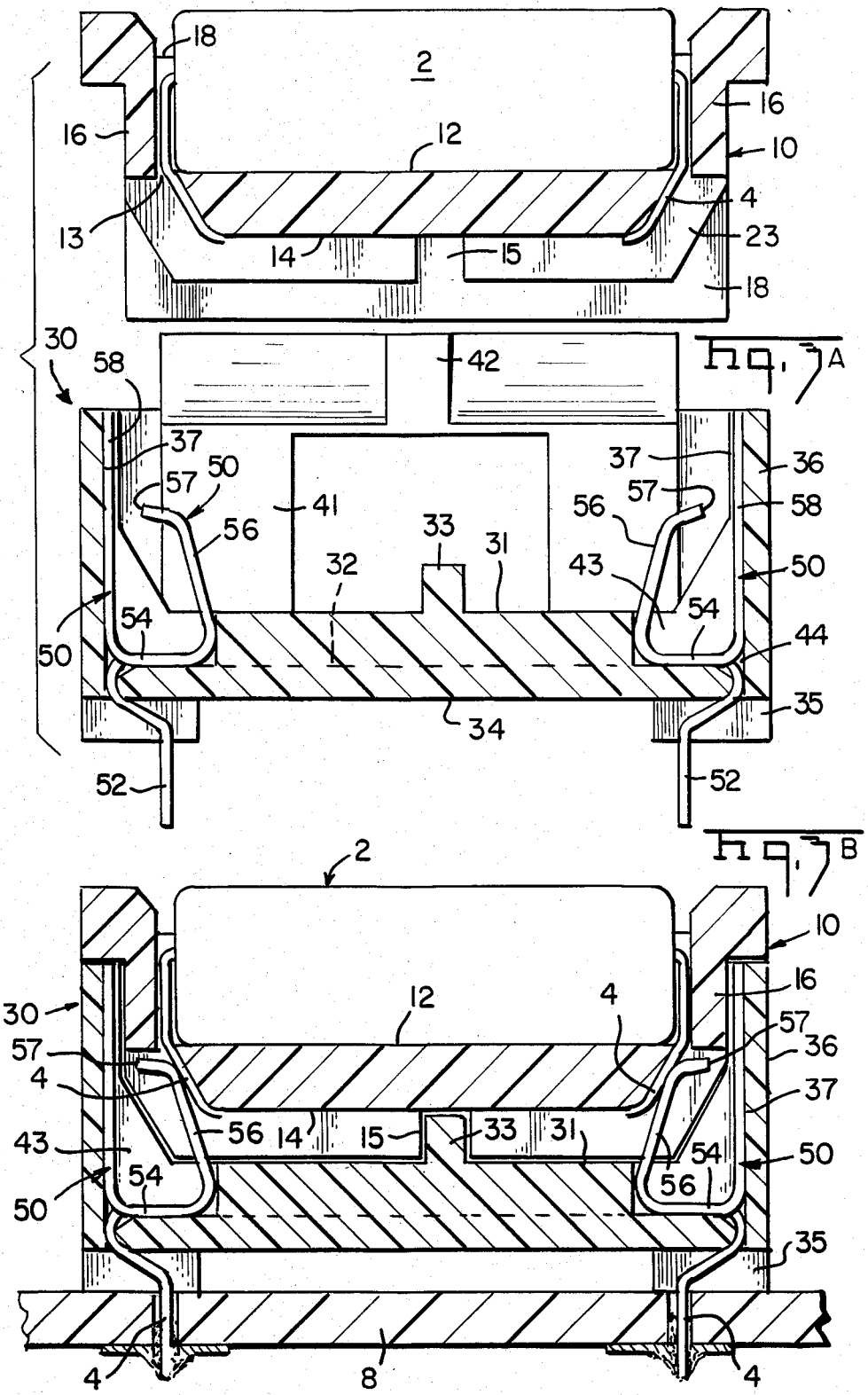

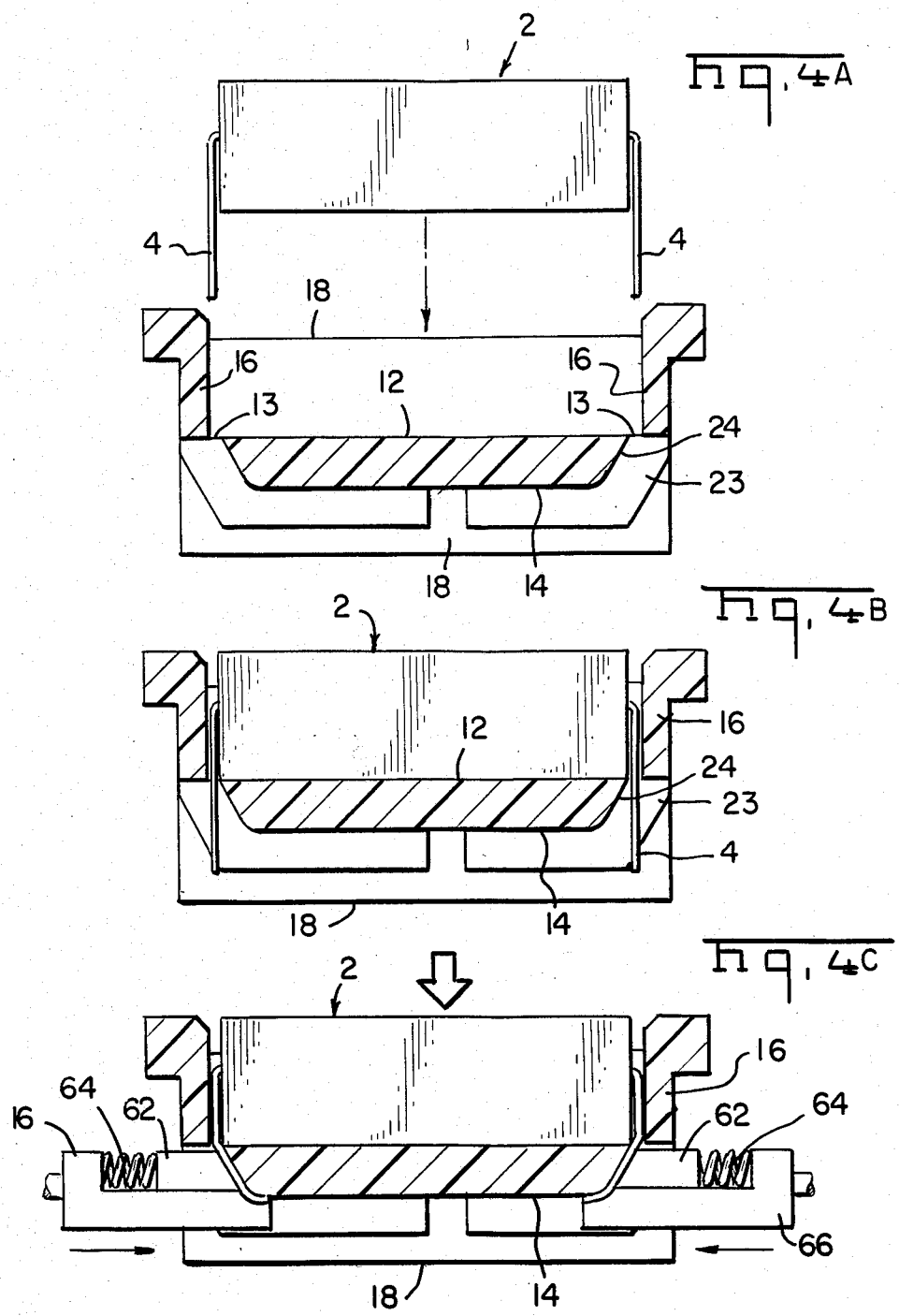

DUAL IN-LINE PACKAGE CARRIER ASSEMBLY

BACKGROUND OF THE INVENTION

The present invention relates to a connector for a modular circuit package, and more particularly to a quick release carrier assembly for a dual in-line package.

The traditional method of mounting a dual in-line package (DIP) to a printed circuit board (PCB) is to solder the leads of the DIP to conductive areas of the PCB such as plated through holes. The major disadvantage of this is the difficulty in replacing the DIP. In some applications it is desirable to remove and replace a DIP frequently, such as home computers where capability for different languages, games, or other programs are desired. Replaceable DIPs are also envisioned for automotive use where different engine control programs responsive to different driver preferences or environmental conditions are desired, and for recording of dashboard functions such as mileage, speed and operating temperature. The connector industry has responded with carrier assemblies where the integrated circuit package is fixed to a carrier which is plugged into a socket fixed to the PCB.

U.S. Pat. No. 3,883,207 discloses an integrated circuit package carrier assembly of the type comprising a carrier for the DIP and a socket having terminals with lead portions extending therethrough which make contact with the PCB. The terminals have resilient contact portions which deflect resiliently as they make contact with respective DIP leads and tend to urge the DIP carrier out of the socket. Resilient latches hold the carrier in the socket when it is fully received. While offering quick release of the DIP carrier, the scheme suffers the disadvantage that the DIP leads are not protected against bending when the carrier is not in place, and further are not protected against static discharge.

U.S. Pat. No. 4,417,777 discloses a carrier through which the DIP leads extend for reception in individual terminal sockets in a socket assembly mounted to the board. While offering somewhat more protection against bending of the DIP leads, the carrier cannot be readily extracted from the socket due to the retention force of each DIP lead. U.S. Pat. No. 4,406,508 discloses a carrier with the DIP leads formed thereagainst, offering more protection against bending the DIP leads. The terminals in the socket, however, are free standing posts requiring careful alignment with apertures in the carrier. Contact force is provided only by relatively small resilient portions stamped from the posts, which could be easily overstressed if the tolerances on the DIP and DIP carrier were not very closely controlled. Further, there is no ready means for release of the carrier from the socket.

SUMMARY

The present invention provides a DIP carrier against which the DIP leads are formed in channels, thus preventing bending of the leads even during repeated insertions in a socket, and further providing means for aligning the resilient contact portions of terminals in the socket with DIP leads. The channels further reduce the possibility of static discharge damaging the IC chip by preventing easy contact with the DIP leads when the carrier is not in place in its socket. The terminals in the socket have long resilient contact portions which make contact with the DIP leads toward the distal end of the contact portions so that the contact portions may deflect considerably without being overstressed. The contact portions of the terminals tend to urge the carrier out of the socket, so that release of a latch on the socket causes the DIP carrier to pop out.

The invention thus provides a robust DIP carrier assembly offering easy insertion and release of the carrier, with little likelihood of damage to the DIP leads or socket terminals even after numerous insertions.

The assembly is especially useful where frequent changes of a logic package are desired.

BRIEF DESCRIPTION OF THE DRAWINGS

FIG. 2 is a side cross-section of the carrier as received in the socket.

FIG. 3A is an exploded end cross-section of the carrier and socket.

FIG. 3B is an end cross-section of the assembled carrier and socket mounted on a PCB.

FIG. 4A to 4C show the assembly of the DIP to the DIP carrier.

DETAILED DESCRIPTION OF THE PREFERRED EMBODIMENT

Figure 1:
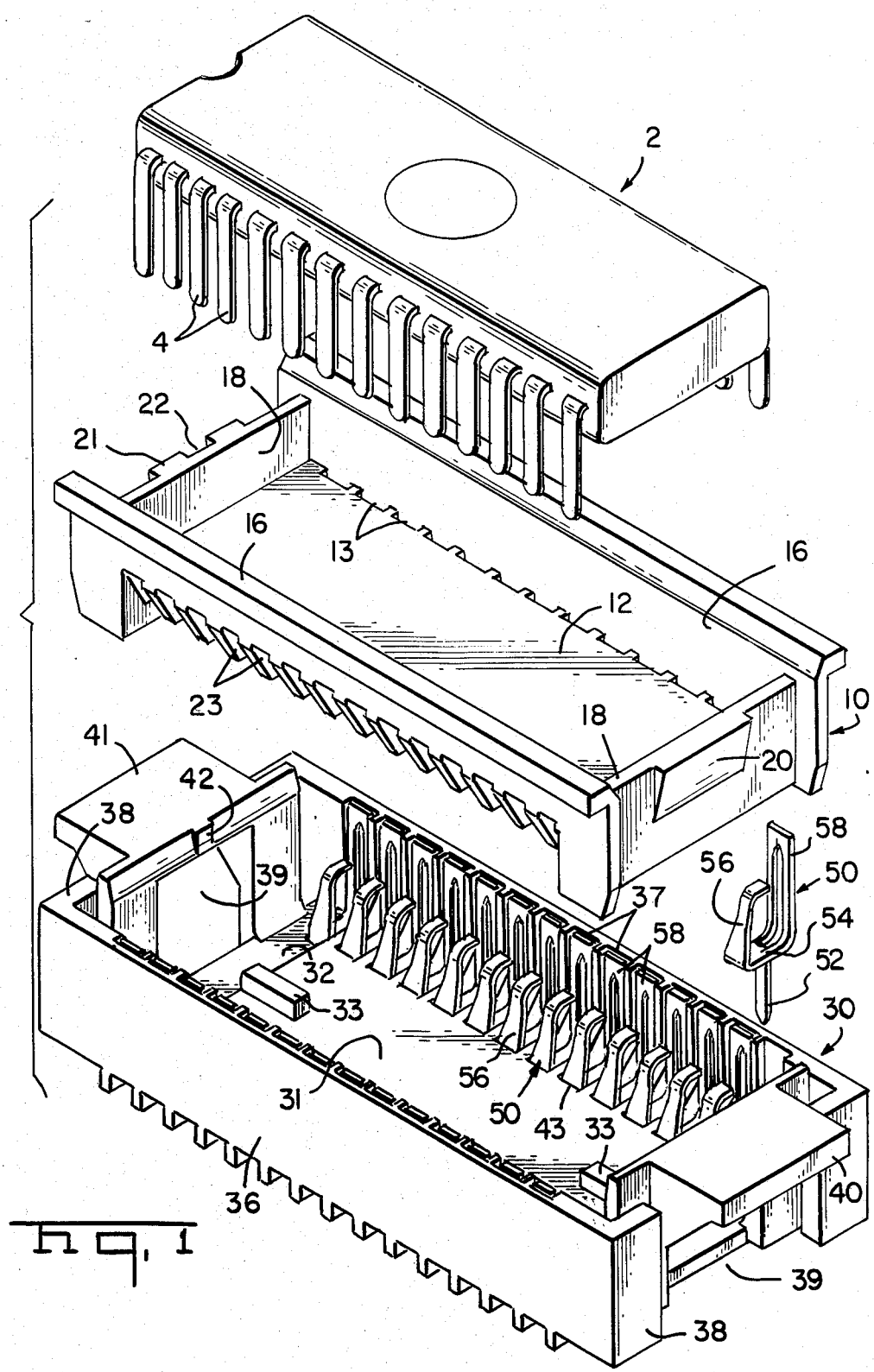
FIG. 1 is an exploded perspective of the DIP and the carrier assembly.

FIG. 1 shows a typical DIP 2 having two parallel rows of leads 4. The carrier 10 comprises a support surface 12 bounded by opposed parallel sidewalls 16 joined by opposed parallel endwalls 18. The support surface 12 has two rows of apertures 13 therein, one row adjacent each sidewall 16. The apertures 13 connect with channels 23 which lie between the support surface 12 and an opposed bottom surface 14 (FIGS. 2 et seq), and are spaced to receive the DIP 2 which is nested against support surface 12 in the carrier 10. The endwalls 18 have latch ledges 20, 21 thereon; ledge 21 has a recess 22 therein which provides a visual aligning means as will be described.

Referring still to FIG. 1, the socket 30 comprises a floor 31 flanked by parallel opposed sidewalls 36 and parallel opposed endwalls 38; each sidewall 38 is interrupted by an opening 39 midway between sidewalls 36. The openings 39 permit outward deflection of respective adjacent resilient latches 40, 41 upstanding from recesses 32 in floor 31, while the endwalls 38 limit the travel of latches 40, 41 to prevent overstress. The latch 41 has an aligning tab 42 for aligning with recess 22 in ledge 21 of the carrier 10. The recesses 32 at opposed ends receive the bottoms of endwalls 18 of the carrier, and keys 33 which positively prevent misaligning or mismating the carrier 10 (see FIG. 2). The keys 33 may thus by their positioning prevent a 180 degree misalignment or by their size prevent mating of an incorrect carrier/socket pair. The terminals 50 are nested in pockets 43 running in two rows, one row adjacent each sidewall 36. The terminals each have a resilient contact portion 56, the contact portions in each row converging toward the contact portions 56 in the opposite row as the contact portions 56 approach the floor 31. Terminals 50 each have an upright portion 58 lying in a respective channel 37 in the adjacent sidewall 36 to assure positive positioning of the terminals 50.

FIG. 2 is a cross-section taken along the length of the assembled carrier 10 and socket 30. Note that the channels 23 are complete between the sides of bottom surface 14, which is notched through the end channels to receive keys 33 on the floor 31. Latches 40, 41 act on ledges 20, 21 respectively of endwalls 38, and are free to move outward in openings 39. Downward pressure on the latches 40, 41 releases the carrier 10, causing the resilient contact portions 56 to eject the carrier 10 from the socket 30. Note the angle on the top of latch ledges 20, 21, which corresponds to the angle on the mating surface of latches 10, 41; this assures that the carrier 10 must be pushed into socket 30 until bottom surface 44 bottoms on the floor 31. The latches 40, 41 then spring back to latch the carrier 10 in place, and the carrier retreats slightly upward to the position shown (see also FIG. 3B).

FIG. 3A shows the carrier 10, with the DIP 2 assembled thereto, poised for reception in the socket 30. Note that the leads 4 are protected by sidewalls 16 and channels 23 into which the leads 4 are formed (FIGS. 4A, 4B, and 4C). The carrier 10 must be oriented so that keyway 15 is aligned above key 33. The terminals 50 each comprise a shoulder portion 54 nested in a pocket 43 in floor 31, a resilient contact portion 56 formed upward from the shoulder 54, the portion 56 having a distal end 57 remote from the shoulder 54, an upright portion 58 formed upward from the shoulder and lying in channel 37 in sidewall 36, and a lead portion 52 struck from the upright portion 58 and extending through an aperture 44. The apertures 44 extend between the sockets 43 and bottom surface 34, opening between standoffs 35. Note the contact portions 56 in the row adjacent one sidewall 36 converge toward the contact portions in the row adjacent the opposite sidewall 36 as the contact portions approach floor 31. The distal end 57 of each contact portion 56 is spaced a sufficient distance from the upright portion 58 to prevent overstressing the contact arm 56 if the distal end 57 should by chance be forced against the upright portion 58.

FIG. 3B shows the carrier 10 fully received in socket 30, the contact portions 56 being deflected outwardly toward sidewalls 36. This tends to urge the carrier 10 out of the socket, but the latching arrangement (FIG. 2) prevents such a dislocation until released. Note that a terminal 50 having the distal end of the contact portion 56 remote from the shoulder 54 offers more resilience where contact is made remote from the shoulder than would a contact portion formed from the upright portion 58 with the distal end in the pocket 43. It will be apparent from examining FIGS. 3A and 3B that a wiping action takes place on the surfaces of leads 4 and respective contact portions 56 as the carrier 10 is inserted and the contact portions 56 deflect. The slight upward retreat of the carrier, discussed above, assures a reverse wiping or "backwipe" action, known to help assure integrity of the electrical contact. The key 33 provides positive means for assuring that the carrier 10 is not misoriented. The socket 30 is shown in place on a PCB 8 with the lead portions 52 of terminals 50 soldered thereto.

FIGS. 4A to 4C depict the method for forming the DIP 2 to the carrier 10. FIG. 4A depicts the leads 4 aligned above apertures 13 in support surface 12; FIG. 4B shows the DIP 2 nested in the carrier 10 with the leads passing through apertures 13 and aligned with open outward facing surfaces 24 in the bottoms of respective channels 23. FIG. 4C shows the forming tooling as it forms the DIP leads 4 against the carrier. The tooling comprises two comb-like forming rams 62, 66 having teeth aligned to enter channels 23 to form the leads 4 against open outward facing surfaces 24. The upper ram 62 first contacts the leads and forms the bend in apertures 13. As springs 64 are compressed, teeth of lower ram 66 form the distal ends of leads 4 against the bottom surface 14 in channels 23. While some spring back of the leads 4 from surfaces 24 may occur, this does not affect the principles disclosed herein.

The foregoing is exemplary and not intended to limit the scope of the claims which follow.

We claim:

1. A dual in-line package carrier assembly comprising:
    a carrier for assembling a dual in-line package thereto, said carrier having a support surface, an opposed bottom surface, and opposed open surface means for assembling the leads of said package thereagainst, said open surface means lying between said support surface and said bottom surface,
    a socket for mounting to a printed circuit board and for receiving said carrier therein, said socket having a floor and an opposed bottom surface, said floor having opposed upstanding sidewalls, a row of apertures spaced as said package leads in the floor adjacent each said sidewall,
    a row of terminals mounted adjacent each sidewall in the socket, each terminal having a lead portion extending through a respective aperture for contact with the printed circuit board, a shoulder portion bearing against said floor, and a resilient contact portion extending obliquely of said floor, said contact portions in one row converging toward the contact portions in the other row as the contact portions approach the socket floor, said contact portions being spaced to contact respective package leads disposed against said open surface means and to deflect resiliently toward the adjacent sidewall when said carrier is received in said socket, said resilient contact portions urging said carrier out when said carrier is received in said socket,
    aligning means effective between said carrier and said socket to assure proper alignment between said package leads and the contact portions of said terminals,
    releasable retaining means effective between said carrier and said socket for retaining said carrier in a first latched position when the carrier is fully received in said socket, and for releasing said carrier to a second unlatched position, said resilient contact portions forcing said carrier from the first latched position to the second unlatched position upon release of said retaining means.

2. A dual in-line package carrier assembly as in claim 1 wherein said open surface means are individual surfaces defined by channels lying between said support surface and said bottom surface of said carrier, said channels being profiled to assure alignment of said package leads and respective contact portions of said terminals therein.

3. A dual in-line package carrier assembly as in claim 1 wherein each said surface means converges toward the other surface means as the surface means approach the bottom surface.

4. A dual in-line package carrier assembly as in claim 1 wherein said carrier further comprises a pair of parallel sidewalls joined by a pair of parallel endwalls extending perpendicular thereto, said sidewalls and said endwalls upstanding from said support surface of said carrier, a row of apertures adjacent each sidewall, said apertures being spaced to receive the leads of said dual in-line package therein, said apertures leading to said open surface means lying between said support surface and said bottom surface.

5. A dual in-line package assembly as in claim 4 wherein said releasable retaining means comprises a pair of resilient latches between the sidewalls of said socket and upstanding from the floor at opposed ends thereof, said latches engaging an endwall of said carrier when said carrier is fully received in said socket.

* * * * *